(12) United States Patent
Waragawa et al.

(10) Patent No.: US 8,455,907 B2
(45) Date of Patent: Jun. 4, 2013

(54) SEMICONDUCTOR LIGHT EMITTING DEVICE HAVING AN OPTICAL PLATE INCLUDING A MENISCUS CONTROL STRUCTURE AND METHOD OF MANUFACTURING

(75) Inventors: Takeshi Waragawa, Tokyo (JP); Kosaburo Ito, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 20 days.

(21) Appl. No.: 13/325,038

(22) Filed: Dec. 13, 2011

(65) Prior Publication Data
US 2012/0140506 A1 Jun. 7, 2012

Related U.S. Application Data

(63) Continuation-in-part of application No. 13/162,151, filed on Jun. 16, 2011.

(30) Foreign Application Priority Data

Jun. 16, 2010 (JP) .................................. 2010-137365
Dec. 13, 2010 (JP) .................................. 2010-276875

(51) Int. Cl.
*H01L 29/20* (2006.01)
*H01L 33/00* (2010.01)

(52) U.S. Cl.
USPC .......... 257/98; 257/79; 257/100; 257/E33.06; 257/432; 438/55; 438/25; 438/72; 362/230; 362/245; 313/486; 313/487

(58) Field of Classification Search
USPC .......................................................... 438/31
See application file for complete search history.

(56) References Cited

U.S. PATENT DOCUMENTS 7,078,732 B1 7/2006 Reeh et al.
7,528,077 B2 * 5/2009 Izuno et al. .................... 438/778

(Continued)

FOREIGN PATENT DOCUMENTS

EP 1 189 291 A2 3/2002
JP 11-340515 A 12/1999

(Continued)

OTHER PUBLICATIONS

List of Potentially Related Pending U.S. Patent Applications citing U.S. Appl. No. 13/162,151 to Kosaburo Ito et al. filed Jun. 16, 2011; U.S. Appl. No. 13/196,868 to Kosaburo Ito et al. filed Aug. 2, 2011; and U.S. Appl. No. 13/229,663 to Toshihiro Seko et al.

(Continued)

*Primary Examiner* — Marcos D. Pizarro
*Assistant Examiner* — Cesar Lopez
(74) *Attorney, Agent, or Firm* — Kenealy Vaidya LLP

(57) ABSTRACT

A semiconductor light-emitting device and a method for manufacturing the same can include a wavelength converting layer in order to emit various colored lights including white light. The semiconductor light-emitting device can include a base board, a frame located on the base board, at least one light-emitting chip mounted on the base board, the wavelength converting layer located between an optical plate and each outside surface of the chips so as to extend toward the optical plate using a meniscus control structure, and a reflective material layer disposed at least between the frame and both side surfaces of the wavelength converting layer and the optical plate. The semiconductor light-emitting device can be configured to improve light-emitting efficiency and color variability between the light-emitting chips by using the reflective material layer as each reflector, and therefore can emit a wavelength-converted light having a high light-emitting efficiency from various small light-emitting surfaces.

20 Claims, 12 Drawing Sheets

U.S. PATENT DOCUMENTS

| | | |
|---|---|---|
| 7,679,100 B2 | 3/2010 | Schwenkschuster et al. |
| 2006/0022211 A1 | 2/2006 | Yatsuda et al. |
| 2007/0086148 A1 | 4/2007 | Schwenkschuster et al. |
| 2008/0054279 A1 | 3/2008 | Hussell et al. |
| 2009/0001490 A1 | 1/2009 | Bogner et al. |
| 2009/0134417 A1 | 5/2009 | Sato et al. |
| 2009/0159912 A1 | 6/2009 | Engl et al. |
| 2011/0180822 A1 | 7/2011 | Ruhnau et al. |
| 2011/0254039 A1* | 10/2011 | Kim et al. ........................ 257/98 |

FOREIGN PATENT DOCUMENTS

| | | |
|---|---|---|
| JP | 2004-31989 A | 1/2004 |
| JP | 2004-40099 A | 2/2004 |
| JP | 2006-48934 A | 2/2006 |
| JP | 2007-103937 A | 4/2007 |
| JP | 2008-507850 A | 3/2008 |
| JP | 2008-103688 A | 5/2008 |
| JP | 2009-135136 A | 6/2009 |
| JP | 2009-526377 A | 7/2009 |
| JP | 2009-218274 A | 9/2009 |
| JP | 2010-118531 A | 5/2010 |

OTHER PUBLICATIONS

List of Potentially Related Pending Applications citing U.S. Appl. No. 13/355,754 to Takeshi Waragawa et al. filed Jan. 23, 2012.

* cited by examiner

SEMICONDUCTOR LIGHT EMITTING DEVICE HAVING AN OPTICAL PLATE INCLUDING A MENISCUS CONTROL STRUCTURE AND METHOD OF MANUFACTURING

This application is a continuation-in-part application claiming priority under 35 U.S.C. §120 to co-pending U.S. patent application Ser. No. 13/162,151 filed on Jun. 16, 2011 entitled Semiconductor Light-Emitting Device And Manufacturing Method, which claims priority under 35 U.S.C. §119 of Japanese Patent Application No. 2010-137365 filed on Jun. 16, 2010. This application separately claims priority under 35 U.S.C. §119 of Japanese Patent Application No. 2010-276875 filed on Dec. 13, 2010. All of the above-referenced priority documents are hereby incorporated in their entirety by reference.

BACKGROUND

1. Field

The presently disclosed subject matter relates to semiconductor light-emitting devices in which light emitted from at least one semiconductor light-emitting chip is wavelength-converted by a wavelength converting layer, and to manufacturing methods for the same. More particularly, the disclosed subject matter relates to semiconductor light-emitting devices for a vehicle light and the like, which can emit light having a high light-emitting efficiency from various small light-emitting surfaces, and to methods of manufacturing such devices.

2. Description of the Related Art

Semiconductor light-emitting devices, in which a part of light emitted from a semiconductor light-emitting chip is converted into light having a different wavelength by a phosphor and in which a mixture light including the light having the different wavelength mixed with the light emitted directly from the light-emitting chip is emitted, have been used as a light source for various lighting units. Conventional semiconductor light-emitting devices including a wavelength converting material, for example, are disclosed in Patent Document No. 1 (Japanese Patent Application Laid Open JP2004-31989).

FIGS. 11a and 11b are side cross-sectional views showing a conventional lead frame type light-emitting device and a conventional radial type light-emitting device, respectively, which are disclosed in Patent Document No. 1. The conventional lead frame type light-emitting device 20 includes: a casing 26 having a cavity 27; a pair of lead frames 22, 23 located on a bottom surface of the cavity 27 of the casing 26; a semiconductor light-emitting chip 21 having a bottom electrode and a top electrode mounted on the lead frame 22, the bottom electrode electrically connected to the lead frame 22, and the top electrode electrically connected to the lead frame 23 via a bonding wire 24; and a phosphor resin 25 located on an opening of the cavity 27 of the casing 26 so as to be able to wavelength-convert light emitted from the semiconductor light-emitting chip 21.

The conventional radial type light-emitting device 30 includes: a casing 36 composed a transparent resin; a pair of lead frames 32, 33 located in the casing 36; a semiconductor light-emitting chip 31 having a first electrode and a second electrode mounted in a cup of the lead frame 32, the first electrode electrically connected to the lead frame 32 via a bonding wire 34a, and the second electrode electrically connected to the lead frame 33 via a bonding wire 34b; a phosphor resin 35 disposed in the cup of the lead frame 32 so as to encapsulate the semiconductor light-emitting chip 31.

The lead frame type light-emitting device 20 may emit a wavelength-converted light via the phosphor resin 25 so as to expand the light from the cavity 27 of the casing 26. Accordingly, it may be difficult for the lead frame type light-emitting device 20 to reduce the size of a light-emitting surface because the light expands from the cavity 27. Additionally, the radial type light-emitting device 30 may emit a wavelength-converted light in a radial fashion from the casing 36, and therefore may also be difficult to reduce the size of a light-emitting surface.

In addition, conventional lead frame type semiconductor light-emitting devices that may emit a wavelength-converted light having a high brightness are disclosed in Patent Document No. 2 (Japanese Patent Application Laid Open JP2004-40099) and Patent Document No. 3 (Japanese Patent Application Laid Open JP2008-507850). A light-emitting device disclosed in Patent Document No. 2 includes a concave reflective material in a cavity that mounts semiconductor light-emitting chips therein so that light emitted from the semiconductor light-emitting chips is efficiently emitted from the cavity.

Another light-emitting device disclosed in Patent Document No. 3 includes a plurality of semiconductor light-emitting chips and a cavity, which mounts the plurality of light-emitting chips at a predetermined interval therein. Thereby, Patent Document No. 3 discloses that semiconductor light-emitting devices may emit a wavelength-converted light having a high brightness from the cavity such that the device may be used as a light source for a vehicle headlight.

However, when the semiconductor light-emitting devices are used as a light source for a lighting unit such as a vehicle headlight, which controls light emitted from the light-emitting devices using a reflector and/or a projector lens, a light-emitting device having a small light-emitting surface may be desired to efficiently control light emitted from the light-emitting device with a small optical structure. Therefore, the semiconductor light-emitting devices including the cavities disclosed in Patent Documents No. 1 to No. 3 may not be a match for the above-described usage.

A semiconductor light-emitting device having a small light-emitting surface can be used as a light source for a vehicle headlight using a projector lens and is disclosed in Patent Document No. 4 (Japanese Patent Application Laid Open JP2009-218274). FIG. 12 is a cross-sectional view showing the conventional semiconductor light-emitting device disclosed in Patent Document No. 4.

The conventional semiconductor light-emitting device 40 includes: a base board 42; semiconductor light-emitting chips 41 mounted on the base board 42; a wavelength converting layer 45 disposed on the semiconductor light-emitting chips 41; and a reflecting member 46 located around the semiconductor light-emitting chips 41 and the wavelength converting layer 45 so as to encapsulate the semiconductor light-emitting chips 41 along with the base board 42 and the wavelength converting layer 45.

The conventional semiconductor light-emitting device 40 can emit a wavelength-converted light from a small light-emitting surface via the wavelength converting layer 45, because the light-emitting surface of the conventional semiconductor light-emitting device 40 can become nearly equal to top surfaces of the semiconductor light-emitting chips 41. In addition, because light emitted from side surfaces of the semiconductor light-emitting chips 41 and the wavelength converting layer 45 may be reflected into the semiconductor light-emitting chips 41 and the wavelength converting layer 45 by the reflecting member 46 and may be emitted from a top surface of the wavelength converting layer 45, a light intensity in a frontward direction of the conventional light-emitting device 40 may improve.

However, when a side surface of the reflecting member 46 is located perpendicular to the base board 42 mounting the semiconductor light-emitting chips 41 in the semiconductor light-emitting device 40 as shown in FIG. 12, light reflected on the side surface of the reflecting member 46, which contacts with the side surfaces of the semiconductor light-emitting chips 41, may return into the semiconductor light-emitting chips 41. Accordingly, because an absorbing band of the semiconductor light-emitting chips 41 includes a wavelength of the reflected light, the reflected light and an absorbing light may increase in the semiconductor light-emitting chips 41. The increase of the reflected light and the absorbing light may cause a decrease in a total amount of light flux emitted from the conventional semiconductor light-emitting device 40.

Therefore, semiconductor light-emitting devices that can emit a wavelength-converted light having a high light-emitting efficiency from a small light-emitting surface have been developed by inventors of the presently disclosed subject matter.

The above-referenced Patent Documents are listed below, and are hereby incorporated with their English abstracts in their entireties.
1. Patent Document No. 1: Japanese Patent Application Laid Open JP2004-31989
2. Patent Document No. 2: Japanese Patent Application Laid Open JP2004-40099
3. Patent Document No. 3: Japanese Patent Application Laid Open JP2008-507850
4. Patent Document No. 4: Japanese Patent Application Laid Open JP2009-218274
5. Patent Document No. 5: Japanese Patent Application No. 2010-137365
6. Patent Document No. 6: Japanese Patent Application No. 2010-173852
7. Patent Document No. 7: Japanese Patent Application No. 2010-201985

The disclosed subject matter has been devised to consider the above and other problems, features, and characteristics. Thus, embodiments of the disclosed subject matter can include semiconductor light-emitting devices that can emit a wavelength-converted light having a high light-emitting efficiency from various small light-emitting surfaces, and associated manufacturing methods that do not cause and/or are designed to prevent some of the above-described problems, concerns, and characteristics related to a wavelength converting layer. The disclosed subject matter can also include a semiconductor light-emitting device using a plurality of semiconductor light-emitting chips, which can be used for wavelength-converting light having a high light-emitting efficiency from various small light-emitting surfaces, and which can also improve color variability between light emitted from the light-emitting chips.

SUMMARY

The presently disclosed subject matter has been devised in view of the above and other problems, features, and characteristics. Aspects of the disclosed subject matter includes a vehicle headlight using semiconductor light-emitting devices having a high light-emitting efficiency, and also includes methods of manufacture that provide the semiconductor light-emitting devices having various small light-emitting surfaces and a high light-emitting efficiency such that can be used as a light source for a vehicle headlight, and which can provide a similar lead time while using a similar manufacture machine in comparison with conventional semiconductor light-emitting devices and processes.

According to an aspect of the disclosed subject matter, a semiconductor light-emitting device can include: a base board having a conductor pattern formed on a mounting surface thereof; a plurality of semiconductor light-emitting chips formed in a substantially cubic shape and each of the light-emitting chips including chip electrodes adjacent a bottom surface thereof, each of the chip electrodes electrically connected to a respective portion of the conductor pattern via solder bumps, and the light-emitting chips aligning so that opposite side surfaces of each of the light-emitting chips become substantially parallel to each other; an optical plate including a meniscus control structure and located over a top surface of each of the light-emitting chips so that a bottom surface thereof covers the top surface of each of the light-emitting chips, and the meniscus control structure extending underneath a bottom surface of the optical plate and along a substantially virtual central surface between adjacent light-emitting chips of the light-emitting chips, and dividing the bottom surface of the optical plate, wherein a cross-sectional shape in a direction perpendicular to the extending direction of the meniscus control structure is formed in a convex shape or a concave shape; and a wavelength converting layer including at least one phosphor and disposed between each of second side surfaces of each of the light-emitting chips and a respective substantially edge of the optical plate adjacent the second side surfaces and between each of the opposite side surfaces of each of the light-emitting chips and at least one meniscus control structure adjacent the opposite side surfaces and a substantially edge of the optical plate adjacent one of the opposite side surfaces so that a respective one of the side surfaces of the wavelength converting layer extends from the outer side surface of each of the light-emitting chips toward the at least one meniscus control structure adjacent the opposite side surfaces of each of the light-emitting chips and the substantially edges of the optical plate adjacent the one of the opposite side surfaces and/or the second side surfaces of each of the light-emitting chips.

Additionally, the semiconductor light-emitting device can include: a frame located adjacent the mounting surface of the base board so as to surround the wavelength converting layer and the light-emitting chips; and a reflective material layer disposed between the frame and both the side surfaces of the wavelength converting layer and the side surface of the optical plate and between the bottom surface of each of the light-emitting chips and the mounting surface of the base board while surrounding the solder bumps, wherein a respective one of side slant surfaces of the reflective material layer contacts with the respective one of the side surfaces of the wavelength converting layer and extends from the outside surface of each of the light-emitting chips toward the at least one meniscus control structure adjacent the opposite side surfaces of each of the light-emitting chips and the substantially edges of the optical plate adjacent the one of the opposite side surfaces and/or the second side surfaces of each of the light-emitting chips.

In the above-described exemplary semiconductor light-emitting device, the convex shape of the meniscus control structure can be located between the bottom surface of the optical plate and an extended surface of each top surface of the adjacent light-emitting chips in order to reduce color variability of light emitted from the device. The device can further include an outer meniscus control structure projecting from the bottom surface of the optical plate toward the light-emitting chips and extending along the edge of the optical plate so as to easily be able to form various light-emitting surfaces, and also can further a particulate spacer disposed in the wavelength converting layer so that a thickness of the wavelength converting layer is defined between at least one top surface of the light-emitting chips and the bottom surface of the optical plate by supporting the bottom surface of the optical plate using the particulate spacer located on the at least one top surface of the light-emitting chips. The respective one of the side slant surfaces of the reflective material layer can be formed in at least one of a substantially linear shape and a convex shape having a curvature of 5 or less extending in a direction toward each of the semiconductor light-emitting chips in order to further improve light-emitting efficiency of the device.

According to the above-described exemplary semiconductor light-emitting device, the device can emit a wavelength-converted light from a top surface of the optical plate that is slightly larger than the top surface of each of the light-emitting chips while the respective one of the side slant surfaces of the reflective material layer can be used as a reflector for each of the light-emitting chips. In this case, even when the device includes the plurality of light-emitting chips, the meniscus control structure and the outer meniscus control structure of the optical plate can easily form the side slant surfaces of the reflective material layer and various small light-emitting surfaces. Thus, the disclosed subject matter can provide semiconductor light-emitting devices that can emit a wavelength-converted light having a high light-emitting efficiency from various small light-emitting surfaces.

In the above-described exemplary semiconductor light-emitting device, when one semiconductor light-emitting chip is used in place of the plurality of light-emitting chips, the device includes the only outer meniscus control structure without the meniscus control structure. However, the above-described features such as the various small light-emitting surfaces can be utilized for the one semiconductor light-emitting chip.

According to another aspect of the disclosed subject matter, a vehicle headlight including the above-described semiconductor light-emitting device can include a heat sink mounting the light-emitting device, and a reflector having an opening portion located adjacent the heat sink so that light emitted from the semiconductor light-emitting device is emitted in a light-emitting direction of the vehicle headlight from the opening portion of the reflector. Thus, the disclosed subject matter can provide vehicle headlights with a simple optical structure by using the above-described semiconductor light-emitting device.

Another aspect of the disclosed subject matter includes methods for manufacturing the above-described semiconductor light-emitting devices. An exemplary method can include: providing the base board; connecting each of the chip electrodes of the semiconductor light-emitting chip to a respective portion of the conductor pattern of the base board via the solder bump; disposing an uncured wavelength converting material between the bottom surface of the optical plate and the outside surface of each of the light-emitting chips so that the respective one of the side surfaces of the wavelength converting layer extends from the outer side surface of each of the light-emitting chips toward the at least one meniscus control structure adjacent the opposite side surfaces of each of the light-emitting chips and the substantially edges of the optical plate adjacent the one of the opposite side surfaces and/or the second side surfaces of each of the light-emitting chips; and disposing an uncured reflective material at least between the frame and both the side surfaces of the wavelength converting layer and the side surface of the optical plate and between the bottom surface of each of the light-emitting chips and the mounting surface of the base board.

In the above-described exemplary method for manufacturing semiconductor light-emitting devices, the same or similar variations of the device can also be employed as set forth in paragraphs [0020] and [0022].

According to the exemplary manufacturing method described above for the semiconductor light-emitting devices, the respective one of the side slant surfaces of the reflective material layer used as the reflector can be formed by disposing an uncured reflective material between the frame and both the side surfaces of the wavelength converting layer and the side surface of the optical plate and between the bottom surface of each of the light-emitting chips and the mounting surface of the base board. The wavelength converting layer and the reflective material layer can be solidified by a similar method as compared to conventional processes. Thus, the method can provide semiconductor light-emitting devices having various small light-emitting surfaces and a high light-emitting efficiency using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
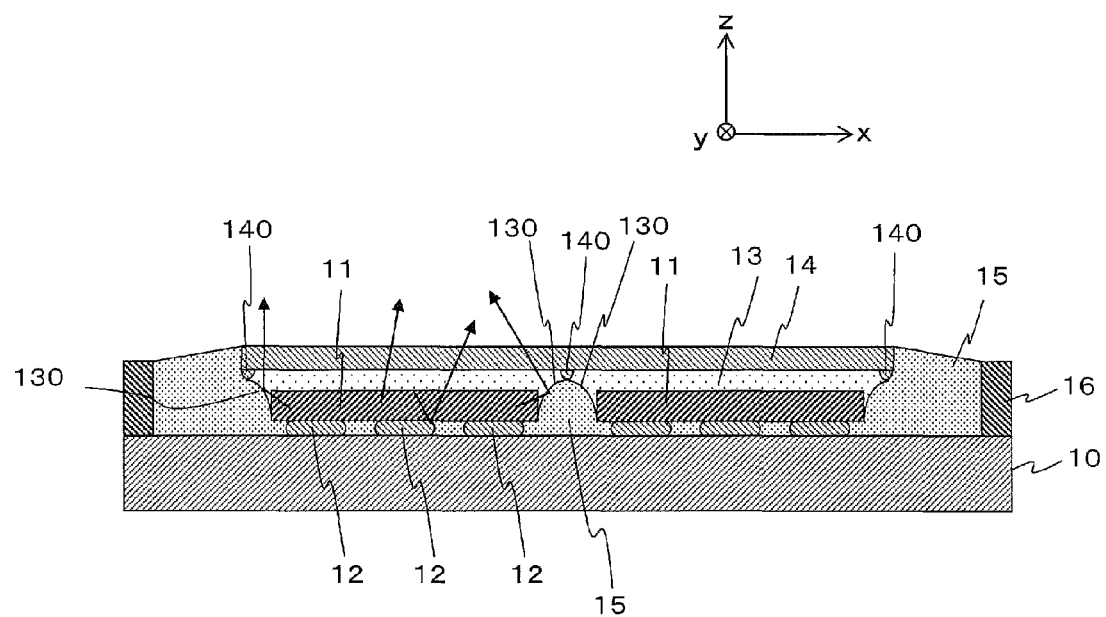
FIG. 1 is an enlarged side cross-sectional view showing an exemplary embodiment of a semiconductor light-emitting device made in accordance with principles of the disclosed subject matter.

Exemplary embodiments and manufacturing methods of the disclosed subject matter will now be described in detail with reference to FIGS. 1 to 10b. FIG. 1 is a side cross-sectional view showing an exemplary embodiment of a semiconductor light-emitting device made in accordance with principles of the disclosed subject matter.

The semiconductor light-emitting device can include a base board 10 having a mounting surface and a conductor pattern (not shown in FIG. 1) formed on the mounting surface, and a plurality of semiconductor light-emitting chips 11 each having a top surface, a bottom surface, opposite side surfaces, second side surfaces located between the opposite side surfaces. Chip electrodes located adjacent the bottom surface of the light emitting chips 11 can be mounted on the mounting surface of the base board 10 via solder bumps 12. Each of the chip electrodes can be electrically connected to a respective portion of the conductor pattern of the base board 10 via the solder bumps 12, and the semiconductor light-emitting chips 11 can be aligned in the x-direction so that the opposite side surfaces of each of the light-emitting chips are substantially parallel with respect to each other.

Additionally, the semiconductor light-emitting device can include an optical plate 14 having an edge located between a bottom surface and a side surface of the optical plate 14. The optical plate 14 can be located over the top surface of each of the semiconductor light-emitting chips 11, and a top surface and bottom surface of optical plate 14 can be slightly larger than the top surface of each of the light-emitting chips 11. A meniscus control structure 140 can extend underneath the bottom surface of the optical plate 14 and along a virtual substantially central surface between adjacent light-emitting chips of the semiconductor light-emitting chips 11, the meniscus control structure 140 thereby dividing the bottom surface of the optical plate 14.

The semiconductor light-emitting device can also include a wavelength converting layer 13 disposed between each of the second side surfaces of each of the light-emitting chips 11 and a respective edge of the optical plate 14 divided by the meniscus control structure adjacent the second side surfaces and between each of the opposite side surfaces of each of the light-emitting chips 11 and at least one meniscus control structure 140 of the optical plate 14 adjacent the opposite side surfaces and an edge of the optical plate 14, which is located between the respective edges of the optical plate 14 adjacent the second side surfaces, adjacent one of the opposite side surfaces so that a respective one of the side surfaces of the wavelength converting layer 13 extends from the outer side surface of each of the light-emitting chips 11 toward the at least one meniscus control structure 140 of the optical plate 14 adjacent the opposite side surfaces of each of the light-emitting chips 11 and the edges of the optical plate 14 adjacent the one of the opposite side surfaces and/or the second side surfaces of each of the light-emitting chips.

Moreover, the semiconductor light-emitting chip can include a frame 16 located along an outer circumference of the base board 10 so as to surround the light-emitting chips 11 and the wavelength converting layer 13. A reflective material layer 15 made of a material having a high reflectivity can be disposed between the frame 16 and both side surfaces of the optical plate 14 and the wavelength converting layer 13 and disposed between the bottom surface of each of the light-emitting chips 11 and the mounting surface of the base board 10 so as to fill a space between the solder bumps 12.

By disposing the reflective material layer 15 between the bottom surface of each of the light-emitting chips 11 and the mounting surface of the base board 10 so as to fill the space between the solder bumps 12, light emitted in a downward direction of the light-emitting chips 11 from the light-emitting chips 11 can be reflected on the reflective material layer 15 and can be emitted from the top surface of each of the light-emitting chips 11. Accordingly, light use efficiency of the semiconductor light-emitting device can improve.

The bottom surface of the optical plate 14 can be slightly larger than the top surface of each of the light-emitting chips 11, and the optical plate 14 can be located over the semiconductor light-emitting chips 11 so that the bottom surface of the optical plate 14 can cover the top surface of each of the light-emitting chips 11. In other words, an outermost periphery of the semiconductor light-emitting chips 11 will be completely blocked from view by the optical plate 14 when the device is viewed from a position on a main optical axis which extends normal to the top surface of the optical plate 14 and in the z-direction as shown in FIG. 1.

Therefore, a side slant surface 130 formed on a boundary between the reflective material layer 15 and the wavelength converting layer 13 can become a reflective surface for each of the plurality of semiconductor light-emitting chips 11, which can reflect light emitted in a crosswise direction from each of the light-emitting chips 11 toward the bottom surface of the optical plate 14 via the wavelength converting layer 13. That is to say, the reflective material layer 15 can perform as a reflector for each of the light-emitting chips 11 by using the side slant surface 130 and the boundary surface contacting with the bottom surface of each of the light-emitting chips 11.

Thus, the semiconductor light-emitting device can improve light-emitting efficiency. In addition, because the reflective material layer 15 can be configured to contact with the side surface of the optical plate 14, the top surface of the optical plate 14 can perform as a light-emitting surface of the semiconductor light-emitting device. Thus, the disclosed subject matter can realize a very small light-emitting surface that is slightly larger than the top surface of each of the light-emitting chips 11, by using the top surface of the optical plate 14.

In the present embodiment of the disclosed subject matter, the optical plate 14 can include the meniscus control structure 140, which projects from the bottom surface of the optical plate 14 toward the virtual substantially central surface between the adjacent light-emitting chips so as to extend along the virtual substantially central surface in the y-direction as shown in FIG. 1. The meniscus control structure 140 can create opposite surfaces of the side slant surface 130 between the adjacent light-emitting chips by controlling meniscus of an uncured wavelength converting material. The meniscus control structure 140 can also be formed as an outer meniscus control structure along the edge of the optical plate 14 so as to project from the bottom surface of the optical plate 14 toward the wavelength converting layer 13. The meniscus control structure 140 will be described in detail later.

The side slant surface 130 can be formed in a linear shape connecting an end of the bottom surface of the optical plate 14 to an end of the bottom surface of each of the light-emitting chips 11, and can also be formed in a concave shape extending in an outward direction away from a center of the semiconductor light-emitting device and in a convex shape extending in an inward direction towards a center of the device, respectively.

In these cases, the reflecting material layer 15 can include the side slant surface 130, which is formed in the convex shape in the inward direction of the semiconductor light-emitting device as shown in FIG. 1, in order to increase light directed toward the bottom surface of the optical plate 14. When the side slant surface 130 is formed in the convex shape in the inward direction of the light-emitting device, a curvature of the convex shape can be formed at 5 or less as described in detail with reference to a result of a computer simulation in Patent Document No. 5.

An end of the side slant surface 130 toward the semiconductor light-emitting chip 11 does not always need be located at the end of the bottom surface of each of the light-emitting chips 11. The end of the side slant surface 130 can be located on the outside surface of each of the light-emitting chips 11, which is between both ends of the top and bottom surface of each of the light-emitting chips 11. When the end of the side slant surface 130 is located on the side surface of each of the light-emitting chips 11, the side slant surface 130 can become the reflex (e.g., a reflector type) surface, which can reflect light emitted in the crosswise direction of the light-emitting chips 11 toward the bottom surface of the optical plate 14 after wavelength-converting of the light via the wavelength converting layer 13.

Each of the semiconductor light-emitting chips 11 can be mounted on the conductor pattern of the mounting surface of the base board 10 with a flip-chip structure. For example, electrodes that are coplanar with the bottom surface of each of the light-emitting chips 11 can be connected to conductor patterns of the mounting surface of the base board 10. When each of the light-emitting chips 11 is a flip-chip type chip, because a light-emitting layer of each of the light-emitting chips 11 may be located close to the bottom surface of each of the light-emitting chips 11, a reflecting feature of the side slant surface 130 can be performed with high efficiency.

The base board 10 can include an Aluminum nitride substrate having a high thermal conductivity and the like, and the conductor patterns can be made from Au (gold) and the like and formed on the base board 10 to mount the semiconductor light-emitting chip 11 and to receive a power supply for the semiconductor light-emitting chip 11. The optical plate 14 can be formed of a transparent resin such as a silicone resin, an epoxy resin and the like, and also can be formed of a phosphor plate including a phosphor such as a phosphor ceramic, a phosphor glass, etc. At least one of the top surface and the bottom surface of the optical plate 14 can be a roughened surface in order to scatter light emitted from the light-emitting chips 11 via the wavelength converting layer 13.

Each of the light-emitting chips 11 can be formed in a substantially cubic shape, and can be blue LED chips having a peak wavelength of 460 nanometers. The wavelength converting layer 13 can include a phosphor to convert light emitted from each of the light-emitting chips 11 into a particular wavelength or range of wavelengths of light. Thus, the phosphor can be excited by the light emitted from each of the light-emitting chips 11, and can emit a wavelength-converted light. Accordingly, the semiconductor light-emitting device can emit a different wavelength from that of each of the light-emitting chips 11 by an additive color mixture of a part of the light emitted from each of the light-emitting chips 11 and the wavelength-converted light excited by another part of the light.

The wavelength converting layer 13 can include a resin layer that is made by mixing a yellow phosphor with a transparent resin such as a silicone resin and the like. The wavelength converting layer 13 can also include at least one of a diffusing material and a particulate spacer having a predetermined particle size (e.g., 10 to 100 micro meters) along with the yellow phosphor. The diffusing material can diffuse light emitted from each of the light-emitting chips 11. The particulate spacer can perform to define a thickness of the wavelength converting layer 13 between the top surface of each of the light-emitting chips 11 and the bottom surface of the optical plate 13 in accordance with the predetermined particle size of the particulate spacer, which may be larger than a maximum particle size of the yellow phosphor, as disclosed in Patent Document No. 6.

In these cases, each of the light-emitting chips 11 can be a blue LED chip having a peak wavelength of 460 nanometers. The yellow phosphor can emit a yellow light upon being excited by blue light emitted from the blue LED chip. The semiconductor light-emitting device can emit substantially white light by an additive color mixture of the excited yellow light emitted from the yellow phosphor and a part of the blue light emitted from the blue LED chip.

The yellow phosphor can include $Y_3Al_5O_{12}:Ce^{3+}$ (YAG) and the like. In place of the yellow phosphor, a red phosphor (e.g., $CaAlSiN_3:Eu^{2+}$) wavelength-converting the blue light emitted from the blue LED chip into red-purple light, and a green phosphor (e.g., $Y_3(Ga, Al)_5O_{12}:Ce^{3+}$) wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

Each of the light-emitting chips 11 can include an LED of InGaN series that emits near-ultraviolet light having a wavelength of approximately 380 nanometers, a laser diode that emits ultraviolet light, and the like. In this case, in order to emit substantially white light, the at least one phosphor can include: a red phosphor (e.g., $CaAlSiN_3:Eu^{2+}$) wavelength-converting the ultraviolet light into red light; a green phosphor (e.g., $(Si, Al)_6 (O, N):Eu^{2+}$) wavelength-converting the ultraviolet light into green light; and a blue phosphor (e.g., $(Sr, Ca, Ba, Mg)_{10}(PO_4)_6Cl_2:Eu^{2+}$) wavelength-converting the ultraviolet light into blue light.

The frame 16 can be formed from the same material as the base board 10, such as with aluminum nitride having a high thermal conductivity, ceramics, and the like. The frame 16 can be attached on the outer circumference of the mounting surface of the base board 10 via an adhesive material so as to surround the semiconductor light-emitting chips 11 and the wavelength converting layer 13 that is located between the semiconductor light-emitting chips 11 and the optical plate 14.

The reflective material layer 15 can be made by dispersing a reflective filler such as titanium oxide, zinc oxide and the like into a transparent resin such as a silicone resin and can be disposed between the frame 16 and both side surfaces of the wavelength converting layer 13 and the optical plate 14 so as to fill a space between the bottom surface of each of the light-emitting chips 11 and the mounting surface of the base board 10. A top surface of the reflective material layer 15 can be formed between an end of the top surface of the optical plate 14 and an inner end of a top surface of the frame 16. Consequently, the semiconductor light-emitting device can be constructed so that the top surface of the optical plate 14 can become the light-emitting surface, which is slightly larger than the top surface of each of the light-emitting chips 11.

According to the semiconductor light-emitting device having the above-described structure, light emitted in an upward direction from the semiconductor light-emitting chips 11 can enter into the wavelength converting layer 13, and a wavelength converted light can be emitted from the top surface of the optical plate 14. Light emitted in a downward direction from the semiconductor light-emitting chips 11 can be reflected at the bottom surface of each of the light-emitting chips 11 by the reflective material layer 15, and a wavelength converted light can be emitted from the top surface of the optical plate 14 as well as the light emitted in the upward direction from the semiconductor light-emitting chips 11.

Light emitted in a crosswise direction from the semiconductor light-emitting chips 11 such as light emitted from the outside surfaces of the light-emitting chips 11 can be reflected toward the optical plate 14 via the wavelength converting layer 13, by the side slant surface 130 that is formed at the boundary between the reflective material layer 15 and the wavelength converting layer 13.

Thereby, the light emitted in the crosswise direction of the light-emitting chips 11 can be prevented from being absorbed by the light-emitting chips 11 because the above described light may not return into the light-emitting chips 11. In addition, because a distance between the outside surfaces of the light-emitting chips 11 and the reflective material layer 15 is very short, the light emitted in the crosswise direction of the light-emitting chips 11 can be prevented from being absorbed by the wavelength converting layer 13.

As described above, the light emitted from the semiconductor light-emitting chips 11 can directly enter into the wavelength converting layer 13. Therefore, the semiconductor light-emitting device can emit a different wavelength light from that of the semiconductor light-emitting chips 11 by use of an additive color mixture of part of the light emitted from the semiconductor light-emitting chips 11 and the wavelength-converted light excited by another part of the light via the wavelength converting layer 13. Light emitted in a crosswise direction from the optical plate 14 can be reflected into the optical plate 14 at the side surface of the optical plate 14 by the reflective material layer 15, and can be emitted from the top surface of the optical plate 14.

Therefore, the disclosed subject matter can provide a small semiconductor light-emitting device having a small light-emitting surface, which is the top surface of the optical plate 14. In this case, because the reflective material layer 15 can be formed in a reflector shape that extends from the outside surface of each of the light-emitting chips 11 in a light-emitting direction of the light-emitting device, the light emitted in the crosswise direction of the light-emitting chips 11 can be prevented from returning to the light-emitting chips 11 and can be reflected toward the optical plate 14 by the side slant surface 130. Thus, the disclosed subject matter can provide a small semiconductor light-emitting device having a high light-emitting efficiency.

In addition, the opposite surfaces of the side slant surface 130 can be easily formed between the adjacent light-emitting chips by using the meniscus control structure 140 so that each shape of the wavelength converting layers 13 formed between the bottom surface of the optical plate 14 and the opposite surfaces formed between the adjacent light-emitting chips becomes substantially same. Accordingly, a color variability between lights emitted from the plurality of light-emitting chips 13 can be extremely reduced.

Moreover, when a density of the phosphor in the wavelength converting layer 13 increases, an adhesive strength between the optical plate 14 and the wavelength converting layer 13 may become reduced. However, a contacting area of the optical plate 14 and the wavelength converting layer 13 can increase due to the meniscus control structure 140, which projects in the wavelength converting layer 13, and also a contacting area between the optical plate and the reflective material layer 15 can increase because of the outer meniscus control structure 140, which is located along the edge of the optical plate 14 so as to project between the reflective material layer 15 and the wavelength converting layer 13. Thereby, the adhesive strength between the optical plate 14 and the wavelength converting layer 13 can be maintained at a high strength.

Furthermore, the outer meniscus control structure 140 can be located along the edge of the optical plate 14 so as to project between the reflective material layer 15 and the wavelength converting layer 13 as described above. Accordingly, even when an outline of the optical plate 14 is different from that of the plurality of light-emitting chips 11 in some degree, an uncured wavelength converting material can be expanded along the outline of the optical plate 14 due to the outer meniscus control structure 140, which is located along the edge of the optical plate 14 so as to project toward the wavelength converting layer 13. Thus, the disclosed subject matter can provide semiconductor light-emitting devices having various light-emitting surfaces such as a circle, an ellipse, a hexagon, etc.

A manufacturing method for the above-described semiconductor light-emitting device will now be described in detail with reference to FIGS. 2a to 2e. FIGS. 2a to 2e are cross-sectional views showing an exemplary manufacturing process for the semiconductor light-emitting device made in accordance with principles of the disclosed subject matter, wherein the outer meniscus control structure 140 is not shown at the edge of the optical plate 14 in order to mainly explain the side slant surface 130 formed between the adjacent light-emitting chips.

Figure 2A:
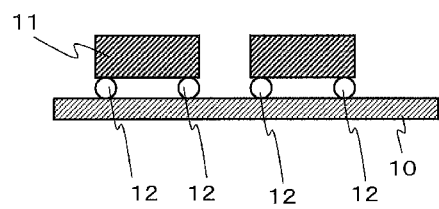
FIGS. 2a to 2e are enlarged cross-sectional schematic views showing an exemplary manufacturing process for a semiconductor light-emitting device made in accordance with principles of the disclosed subject matter.

Process (a) is preparing the base board 10 having the conductor patterns formed on the mounting surface and the plurality of semiconductor light-emitting chips 11, and mounting the semiconductor light-emitting chips 11 on the conductor pattern of the base board 10 via the solder bumps 12 as shown in FIG. 2a.

Figure 2B:
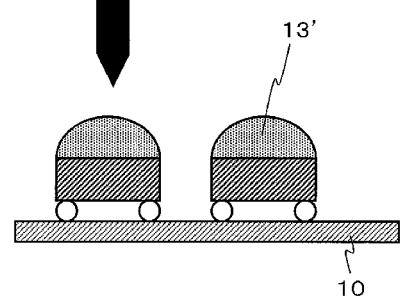

Process (b) is applying an uncured wavelength converting material 13', in which the phosphor is dispersed in a transparent resin such as a silicon resin, on the top surface of each of the light-emitting chips 11 by a dispenser and the like, as shown in FIG. 2b.

Figure 2C:
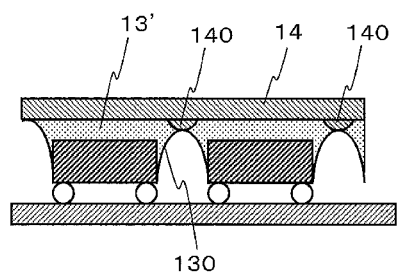

Process (c) is mounting the optical plate 14 that is formed in a slightly larger size than the top surface of each of the light-emitting chips 11 on the uncured wavelength converting material 13', wherein the side slant surface 130 is formed from the outside surface of each of the light-emitting chips toward the bottom surface of the optical plate 14 as the reflector for each of the light-emitting chips while the opposite surfaces of the side slant surface 130 are formed between the adjacent light-emitting chips by using the meniscus control structure 140, and solidifying the uncured wavelength converting material 13' under a prescribed curing condition, as shown in FIG. 2c. In this case, the uncured wavelength converting material 13' may be semi-solidified under a semi-curing condition if the shape of the wavelength converting layer 13 including the side slant surface 130 does not vary in following processes.

Figure 2D:
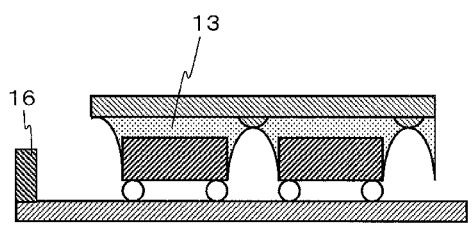
Figure 2E:
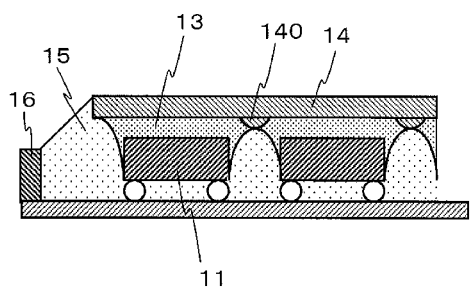

Process (d) is attaching the frame 16 on the outer circumference of the mounting surface of the base board 10 via the adhesive material so as to surround the light-emitting chips 11 and the wavelength converting layer 13, as shown in FIG. 2d.

Process (e) is disposing an uncured reflective material between the frame 16 and both the side surfaces of the wavelength converting layer 13 and the side surface of the optical plate 14 and in the space between a bottom surface of each of the light-emitting chips 11 and the mounting surface of the base board 10 so that the uncured reflective material can contact with both the outside surfaces of the wavelength converting layer 13 and the optical plate 14 without a space, by a dispenser and the like, thus forming the reflective material layer 15 including the above-described side slant surface 130 by solidifying the uncured reflective material under a prescribed curing condition, and finishing the semiconductor light-emitting device. The above process steps can be done consecutively and sequentially, or can be interchanged in timing and non-sequential.

By creating the side slant surface 130 of the wavelength converting layer 13 using a surface tension of the uncured wavelength converting material 13' and the meniscus control structure 140 of the optical plate 14, and by disposing the uncured reflective material between the frame 16 and both the outside surfaces of the wavelength converting layer 13 and the side surface of the optical plate 14, the side slant surface 130 of the reflective material layer 15 can be formed in a prescribed shape and the reflective material layer 15 can be attached to both side surfaces of the optical plate 14 and the frame 16.

Thereby, the reflector shape having a predetermined shape can be formed from the outside surface of each of the light-emitting chips 11 toward the edge of the bottom surface of the optical plate 14 adjacent the side surfaces of the outside surface of each of the light-emitting chips 11 and the meniscus control structure adjacent at least one side surface of the outside surfaces without a machining process. In addition, the manufacturing method can also dispose the reflective material in the space between the bottom surface of each of the light-emitting chips 11 and the mounting surface of the base board 10 when disposing the reflective material between the frame 16 and both the outside surfaces of the wavelength converting layer 13 and the side surface of the optical plate 14.

Accordingly, the manufacturing method can prevent the semiconductor light-emitting chips 11 from absorbing light that is returned on the outside surface of each of the light-emitting chips 11 and can also prevent a decay of light emitted in the downward direction of the light-emitting chips 11. Thus, the manufacturing method can provide semiconductor light-emitting devices having a high light-emitting efficiency. Moreover, because the light-emitting surface of the device is small, light emitted from the semiconductor light-emitting device can be efficiently controlled by a small and simple optical structure.

In the above-described manufacturing method, the uncured transparent material 13' is applied on the top surface of each of the light-emitting chips 11 in process (b). However, the embodiment of the disclosed subject matter is not necessarily limited to this method. For example, the uncured wavelength converting material 13' can be applied underneath the bottom surface of the optical plate 14, and also the uncured wavelength converting material 13' can be applied both on the top surface of each of the light-emitting chips 11 and underneath the bottom surface of the optical plate 14.

In addition, the uncured wavelength converting material 13' can be disposed between the top surface of each of the light-emitting chips 11 and the bottom surface of the optical plate 14 and around the outside surface of each of the light-emitting chips 11 while the semiconductor light-emitting chips 11 mounted on the base board 10 are directed downward. In this case, the uncured wavelength converting material 13' can be disposed between the top surface of each of the light-emitting chips 11 and the bottom surface of the optical plate 14 and around the outside surface of each of the light-emitting chips 11 by applying the uncured wavelength converting material 13' underneath the top surface of each of the light-emitting chips 11.

Moreover, the uncured wavelength converting material 13' can be disposed between the top surface of each of the light-emitting chips 11 and the bottom surface of the optical plate 14 and around the outside surface of the semiconductor light-emitting chip 11 by applying the uncured wavelength converting material 13' on the bottom surface of the optical plate 14. The uncured wavelength converting material 13' can also be disposed between the top surface of each of the light-emitting chips 11 and the bottom surface of the optical plate 14 and around the outside surface of each of the light-emitting chips 11 by applying the uncured wavelength converting material 13' both underneath the top surface of each of the light-emitting chips 11 and on the bottom surface of the optical plate 14.

The above-described manufacturing method can vary the shape of the side slant surface 130 of the reflective material layer 15 by adjusting a shape of the meniscus control structure 140, in addition to the amount of the uncured wavelength converting material 13' which is disposed between the top surface of each of the light-emitting chips 11 and the bottom surface of the optical plate 14.

FIGS. 3a to 3e are cross-sectional views from the y-direction (a cross-sectional view of x-z surface) showing exemplary meniscus control structures in the embodiment of FIG. 1, wherein the meniscus control structures 140 of the optical plate 14 project from the bottom surface of the optical plate 14 and extend linearly in the y-direction so as to cross the optical plate 14. Each of cross-sectional shapes of the meniscus control structures 140 shown in FIGS. 3a to 3e is a triangle having curves toward an inner side thereof, an isosceles triangle, a semicircle, a rectangular and a trapezoid, respectively.

Figure 3A:
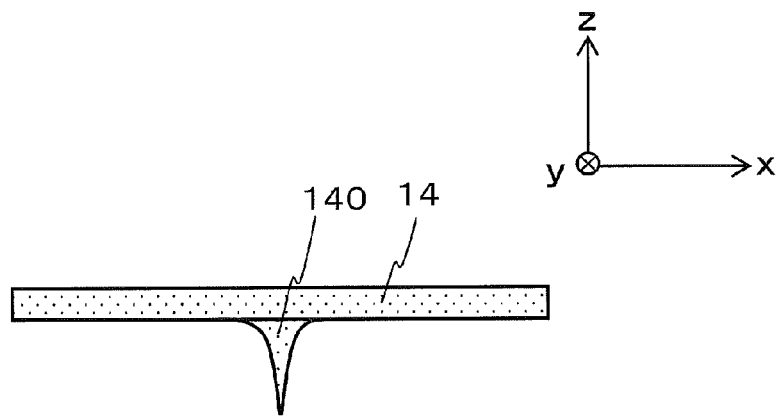
FIGS. 3a to 3e are enlarged cross-sectional views in the y-direction showing exemplary meniscus control structures of the semiconductor light-emitting device of FIG. 1.
Figure 3B:
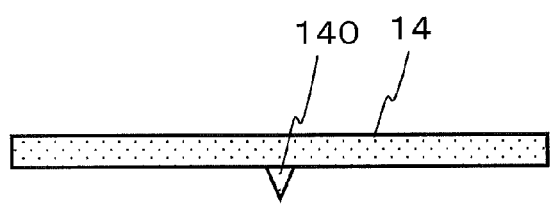
Figure 4:
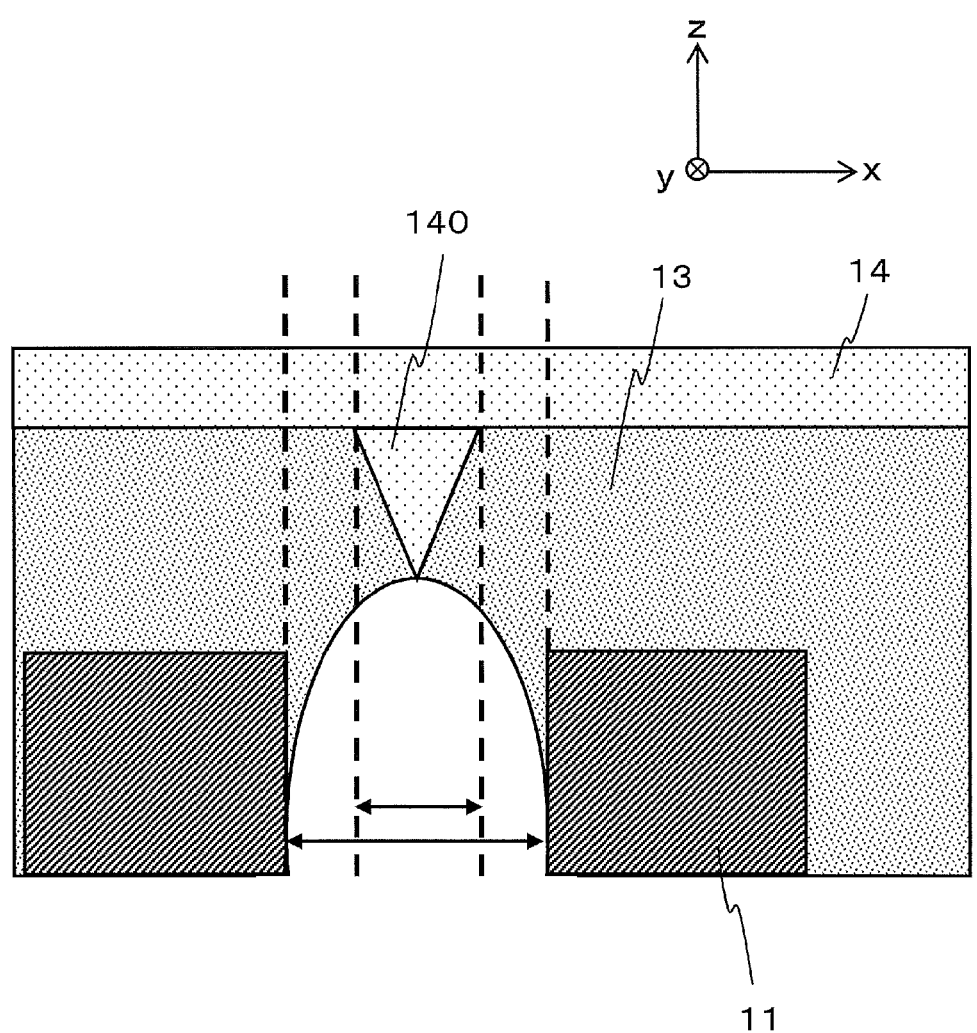
FIG. 4 is a partial enlarged cross-sectional view from the y-direction showing an exemplary shape of opposite surfaces of a wavelength converting layer in the embodiment of the semiconductor light-emitting device of FIG. 1 when each lower end of the exemplary meniscus control structures is sharp in view from the y-direction.

FIG. 4 is a partial enlarged cross-sectional view from the y-direction showing an exemplary shape of the opposite surfaces of the wavelength converting layer 13 in the present embodiment of the semiconductor light-emitting device when each lower end of the meniscus control structures 140 is sharp in view from the y-direction, such as the meniscus control structures 140 shown in FIGS. 3a and 3b. In these cases, the amount of the wavelength converting layers 13 can increase near the meniscus control structure 140 because each volume of the meniscus control structures 140 can be reduced. Accordingly, when each of the meniscus control structures 140 shown in FIGS. 3a and 3b is employed as the meniscus control structure 140 of the optical plate 14 in the embodiment of FIG. 1, a wavelength converting efficiency of the wavelength converting layer 14 can improve.

Figure 3C:
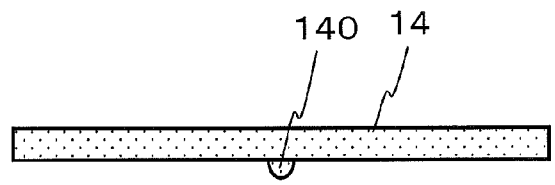
Figure 3D:
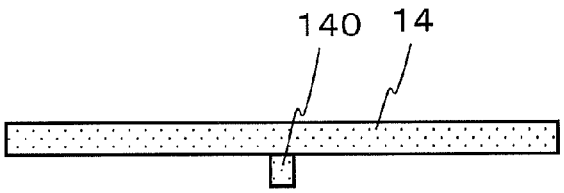
Figure 3E:
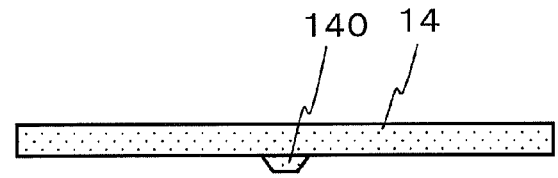
Figure 5:
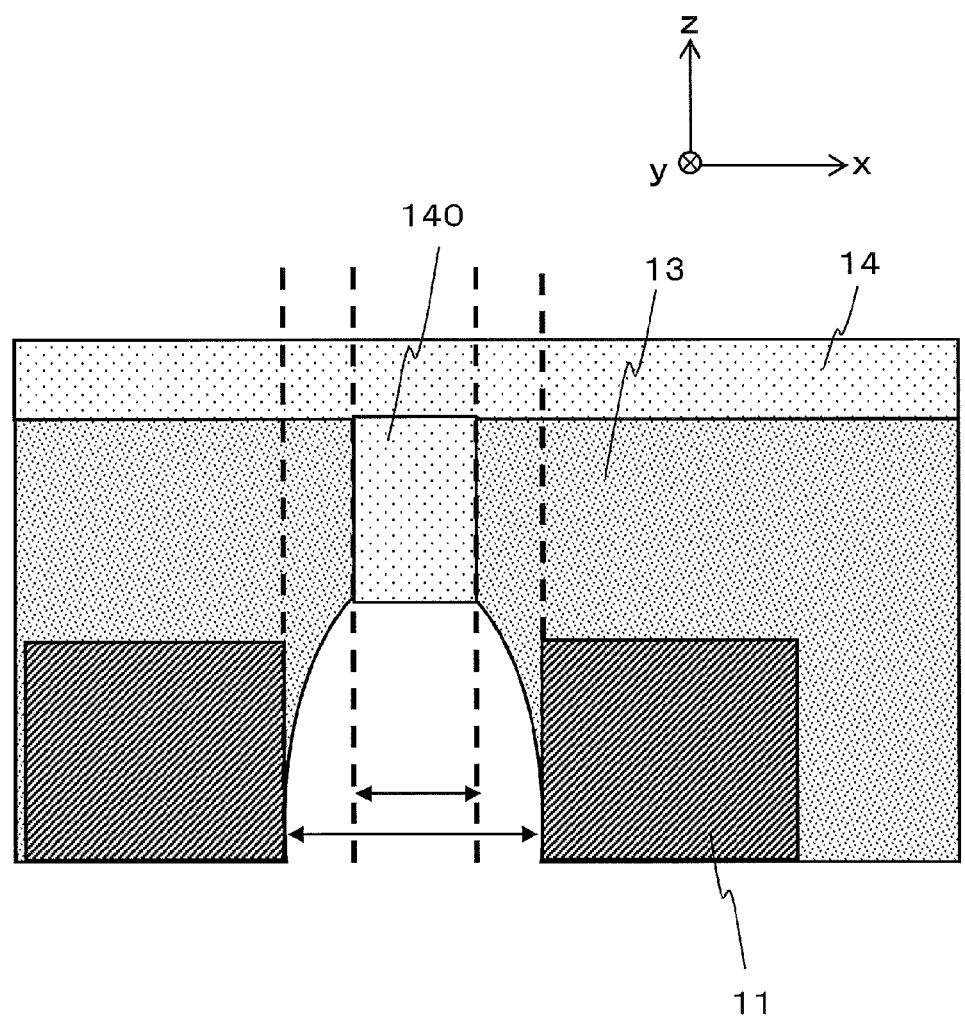
FIG. 5 is a partial enlarged cross-sectional view from the y-direction showing an exemplary shape of the opposite surfaces of the wavelength converting layer in first embodiment of the semiconductor light-emitting device of FIG. 1 when each lower end of the exemplary meniscus control structures is planar in view from the y-direction.

FIG. 5 is a partial enlarged cross-sectional view of the y-direction showing an exemplary shape of the opposite surfaces of the wavelength converting layer 13 in the embodiment of the semiconductor light-emitting device of FIG. 1 when each lower end of the meniscus control structures 140 is planar in view from the y-direction, such as the meniscus control structures 140 shown in FIGS. 3*d* and 3*e*. In these cases, the opposite surfaces can be created between each side surface of the adjacent light-emitting chips and a respective corner of the lower end adjacent the meniscus control structure 140, and therefore can be easy to create between the adjacent light-emitting chips 11.

Therefore, when a wettability of the uncured wavelength converting material 13' is low and/or when a viscosity of the uncured wavelength converting material 13' is low, each of the meniscus control structures 140 shown in FIGS. 3*d* and 3*e* can be employed as the meniscus control structure 140 of the optical plate 14 in the embodiment of FIG. 1. On the contrary, when the wettability of the uncured wavelength converting material 13' is relatively high and/or when the viscosity of the uncured wavelength converting material 13' is relatively high, each of the meniscus control structures 140 shown in FIGS. 3*a* and 3*b* can be employed as the meniscus control structure 140 of the optical plate 14 in the embodiment of FIG. 1.

The meniscus control structure 140 shown in FIG. 3*c* is used as the meniscus control structure 14 in the embodiment of FIG. 1, and may perform as a medium operation between each of the meniscus control structures 140 shown in FIGS. 3*a* and 3*b* and each of the meniscus control structures 140 shown in FIGS. 3*d* and 3*e*. The above-described meniscus control structure 140 in the embodiment of FIG. 1 can be located underneath the bottom surface of the optical plate 14 and along the virtual substantially central surface between the adjacent light-emitting chips, as described above.

A width in the x-direction of the meniscus control structure 140 can be thinned, for example, the width can be 20 percent less than a space between the adjacent light-emitting chips 11. However, even when the width of the meniscus control structure 140 is 20 percent more than the space between the adjacent light-emitting chips 11, the light-emitting device may not cause a visible variability in regard to a color tone and a light intensity because of a thickness of the optical plate 14 if the width of the meniscus control structure 140 is 80 percent less than the space, although the width may depend on the height in the z-direction of the optical plate 14, as described next.

Figure 6:
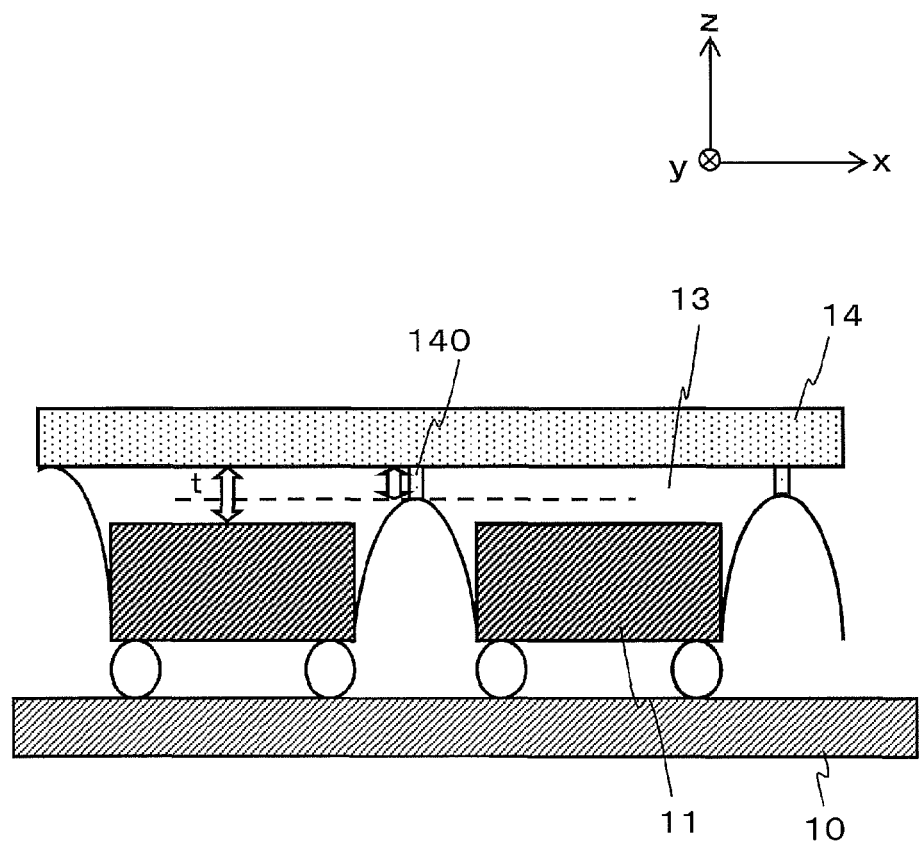
FIG. 6 is a partial enlarged cross-sectional view from the y-direction showing an exemplary shape of the opposite surfaces of the wavelength converting layer in the embodiment of the semiconductor light-emitting device of FIG. 1 when each height of the exemplary meniscus control structures is within a thickness of the wavelength converting layer in view from the y-direction.
Figure 7:
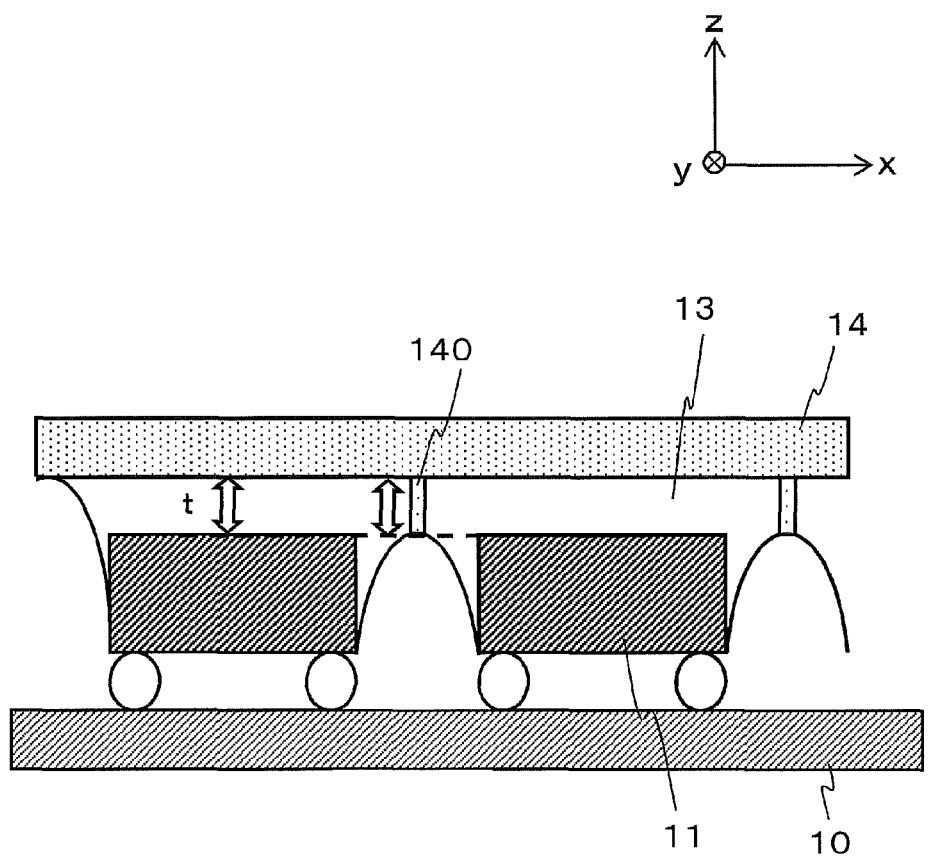
FIG. 7 is a partial enlarged cross-sectional view from the y-direction showing an exemplary shape of the opposite surfaces of the wavelength converting layer in the embodiment of the semiconductor light-emitting device of FIG. 1 when each height of the exemplary meniscus control structures is substantially equal to the thickness of the wavelength converting layer in view from the y-direction.

The height of the meniscus control structure 140 can be less than the thickness-t of the wavelength converting layer 13 between the bottom surface of the optical plate 14 and an extended imaginary surface extending from each top surfaces of the adjacent light-emitting chips as shown in FIG. 6, and also can be nearly equal to the thickness-t of the wavelength converting layer 13 as shown in FIG. 7. In these cases, because each of the wavelength converting layers 13 that are located from each of the outside surfaces of the adjacent light-emitting chips toward the optical plate 14 may be formed in the substantially same shape, the color variability between lights emitted from the adjacent light-emitting chips can be reduced.

Figure 8:
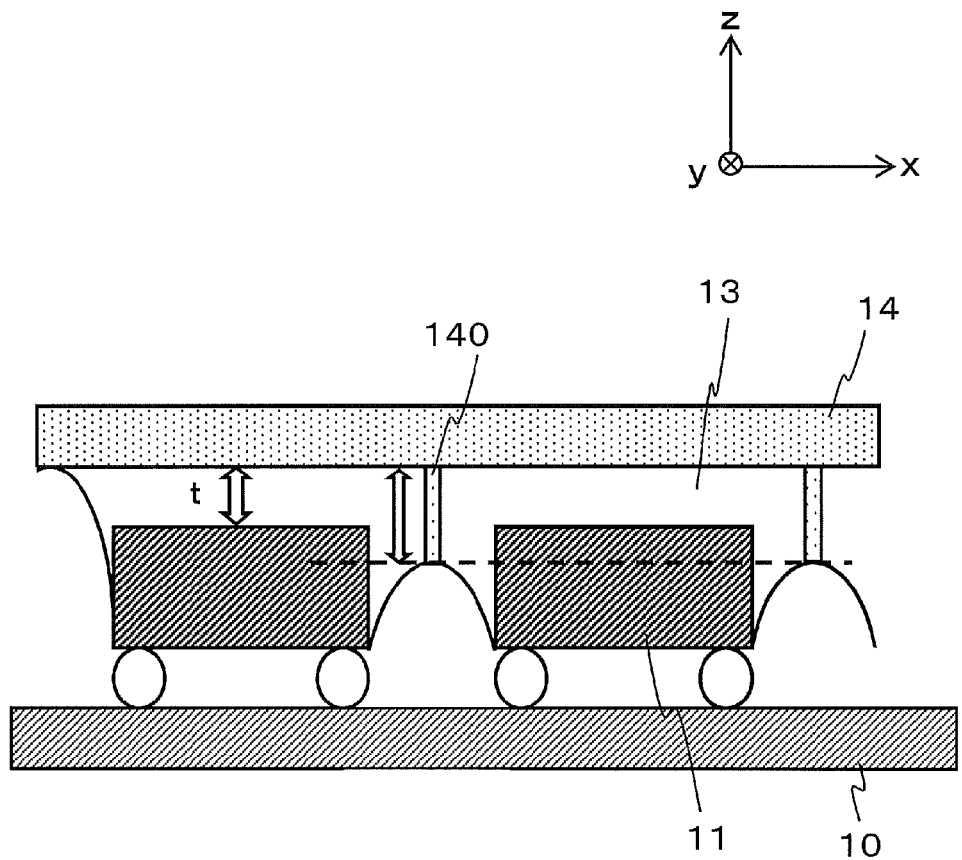
FIG. 8 is a partial enlarged cross-sectional view from the y-direction showing an exemplary shape of the opposite surfaces of the wavelength converting layer in the embodiment of the semiconductor light-emitting device of FIG. 1 when each height of the exemplary meniscus control structures is more than the thickness of the wavelength converting layer in view from the y-direction.
Figure 9A:
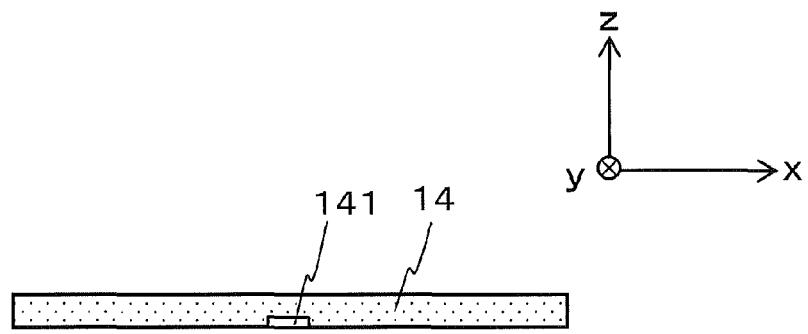
FIGS. 9a to 9d are enlarged cross-sectional views from the y-direction showing exemplary meniscus control structures in another embodiment of a semiconductor light-emitting device made in accordance with principles of the disclosed subject matter.
Figure 9B:
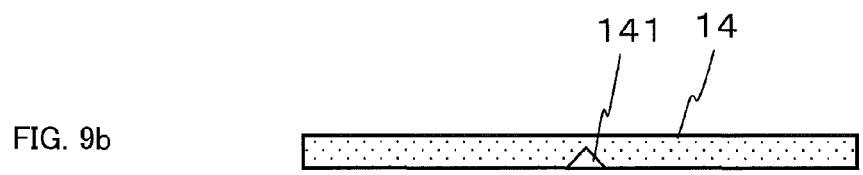
Figure 9C:
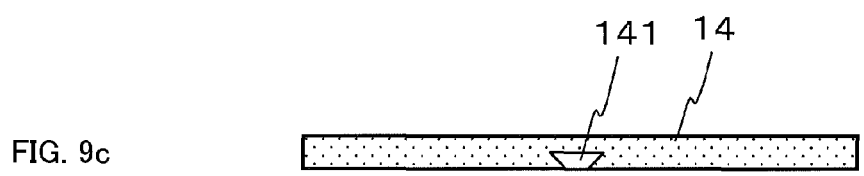
Figure 9D:
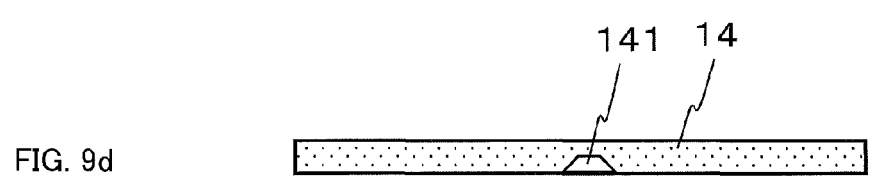

However, when the height of the meniscus control structure 140 can be more than the thickness-t of the wavelength converting layer 13 between the bottom surface of the optical plate 14 and the top surface of each of the light-emitting chips 11 as shown in FIG. 8, each of the wavelength converting layers 13 that are located from each of the outside surface of the adjacent light-emitting chips toward the optical plate may become difficult to be formed in a substantially same shape. Therefore, because a device having the structure shown in FIG. 8 may be subject to the color variability, the height of the meniscus control structure 140 can be less than the thickness-t of the wavelength converting layer 13 between the bottom surface of the optical plate 14 and the top surface of each of the light-emitting chips 11.

The light-emitting device can decrease the height of the meniscus control structure 140 of the optical plate 14 if the side slant surface 130 can be created by the uncured wavelength converting material 13' and the meniscus control structure 140 due to a meniscus control. A minimum height of the meniscus control structure 140 may be varied by the viscosity of the uncured wavelength converting material 13' and the wettability of the uncured wavelength converting material 13' to the optical plate 14 and the side surfaces of the light-emitting chips 11. For example, the meniscus control structure 14 can be set up at an approximately third height of the thickness of the wavelength converting layer 13 between the bottom surface of the optical plate 14 and the top surfaces of the light-emitting chips 11.

In addition, when the opposite surfaces formed between the adjacent light-emitting chips can be created between the uncured wavelength converting material 13' and the meniscus control structure 140 of the optical plate 14, the amount of the uncured wavelength converting material 13' that is disposed between the bottom surface of the optical plate 14 and the top surface of each of the light-emitting chips can be adjusted so as to create as a part of the side slant surface 130 having a prescribed curvature while forming the wavelength converting layer 13 having a predetermined thickness, in processes (b) and (c) as shown in FIGS. 2*a* to 2*e*.

In this case, when the amount of the uncured wavelength converting material 13' is in excess, the prescribed curvature of the side slant surface 130 may be easy to make larger. On the other hand, when the amount of the uncured wavelength converting material 13' becomes small, the prescribed curvature of the side slant surface 130 may be easily made smaller. Accordingly, the prescribed curvature of the side slant surface 130 may be balanced by locating the outer meniscus control structure 140 along the edge of the optical plate 14 in the same direction as the meniscus control structure 14, which is located between the adjacent light-emitting chips 11.

The outer meniscus control structure 140 can be formed in the same shape as the meniscus control structure 14 as described above. The top surface of the optical plate 14 can easily be formed in various shapes as the light-emitting surface of the device by locating the outer meniscus control structure 140 along the edge of the optical plate 14, as long as the shapes are slightly larger than the outline of the top surfaces of the light-emitting chips 11.

Even when the top surface of the optical plate 14 is not similar to the outline of the top surfaces of the light-emitting chips 11, the uncured wavelength converting material 13' can be disposed between the side surface of each of the light-emitting chips 11 and at least one of an inner surface and an under surface of the outer meniscus control structure 140 of the optical plate 14 and the meniscus control structure located between the adjacent light-emitting chips while the side slant surface 130 is formed at an outer circumference of the wavelength converting layer 13 by using the uncured wavelength converting material 13' and both the outer meniscus control structure 140 and the meniscus control structure.

Thus, the disclosed subject matter can provide semiconductor light-emitting devices, which cannot only improve the color variability between the adjacent light-emitting chips 11 but also emit light having uniform color tone and a high light-emitting efficiency from the light-emitting surface having the various shapes by using the outer meniscus control structure 140 and the meniscus control structure 14, which is located underneath the bottom surface of the optical plate 14 between the adjacent light-emitting chips 11.

FIGS. 9a to 9d are enlarged cross-sectional views from the y-direction showing exemplary meniscus control structures for another embodiment of a semiconductor light-emitting device made in accordance with principles of the disclosed subject matter. A difference between the embodiment of FIG. 9 and the embodiment of FIG. 1 relates to the meniscus control structure. Therefore, the meniscus control structures 141 of the optical plate 14 are described with reference to FIGS. 9a to 9d, and other structures and a manufacturing method of the embodiment of FIG. 9 will be abbreviated.

The meniscus control structures 141 shown in FIGS. 9a to 9d can be formed in a linear concave shape, which is located from the bottom surface of the optical plate 14 toward the top surface of the optical plate 14 and extends along the virtual substantially central surface between the adjacent light-emitting chips 11. Each of cross-sectional shapes in view from the y-direction of the meniscus control structures 141 (cross-sectional shapes taken along the x-z surface) shown in FIGS. 9a to 9d is formed in a rectangular shape, a triangle shape, an inverted trapezoid shape and a trapezoid shape, respectively.

In these cases, the opposite surfaces of the meniscus control can be created between each of the opposite side surfaces of each of the light-emitting chips 11 and a respective corner of the meniscus control structure 141 adjacent the opposite side surfaces by using the meniscus control structure 141 and the uncured wavelength converting material 13' in process (c) as shown in FIGS. 2a to 2e. When the meniscus control structure 141 of the embodiment of FIG. 9 is employed for the device, the thickness of the wavelength converting layer 13 between the top surface of each of the light-emitting chips and the bottom surface of the optical plate 14 can be thinned as compared with that of the embodiment of FIG. 1. Accordingly, when the density of the phosphor in the wavelength converting layer 13 is high and the wavelength converting layer 13 is formed in a thin shape, the embodiment of FIG. 9 including the meniscus control structure 141 of the concave shape may be useful to manufacture the device.

Figure 10A:
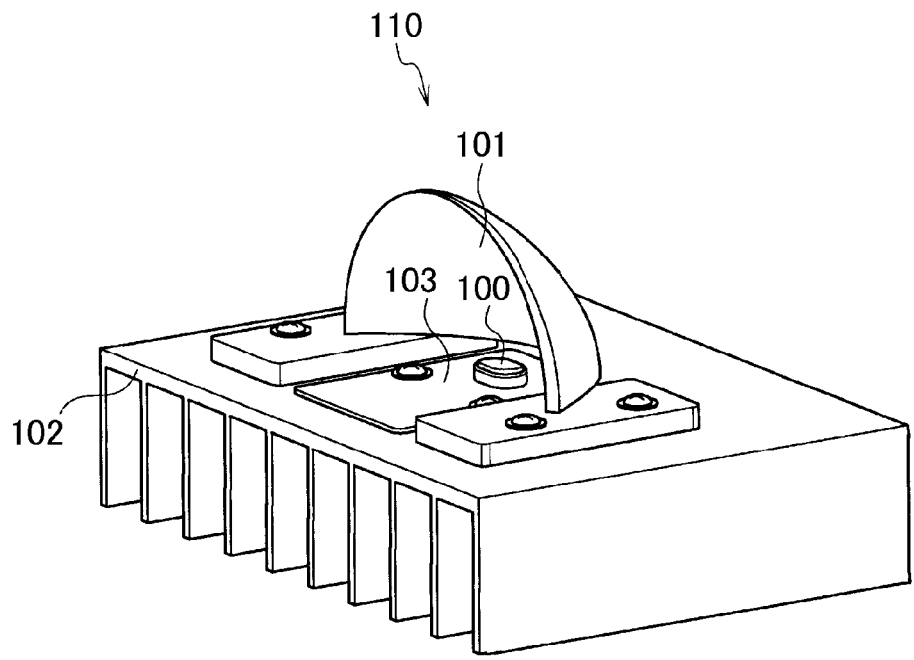
FIG. 10a is a schematic perspective view showing an exemplary vehicle headlight using a semiconductor light-emitting device made in accordance with principles of the disclosed subject matter.
Figure 10B:
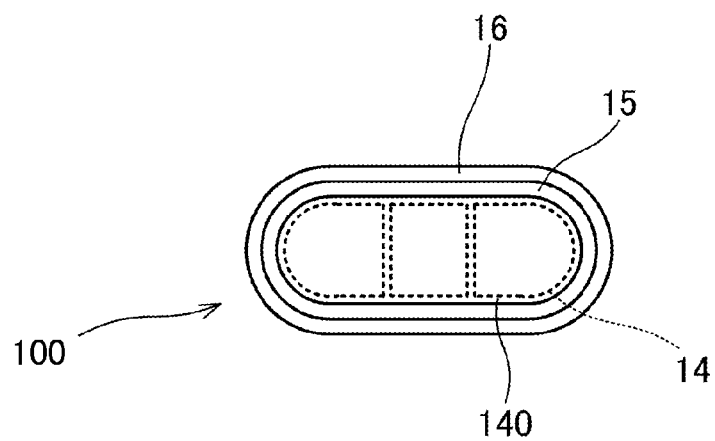
FIG. 10b is an enlarged top view showing the semiconductor light-emitting device.
Figure 11A:
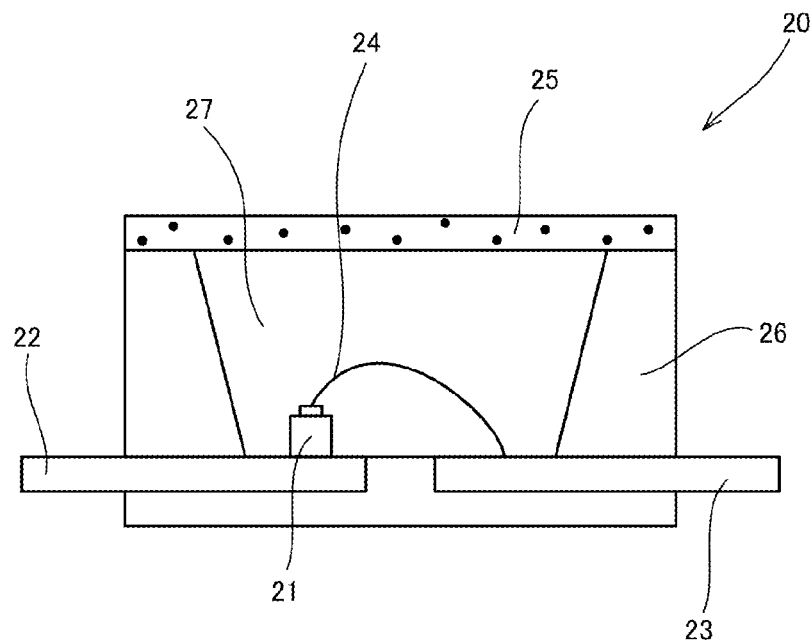
FIGS. 11a and 11b are side cross-sectional views showing a conventional lead frame type light-emitting device and a conventional radial type light-emitting device, respectively.
Figure 11B:
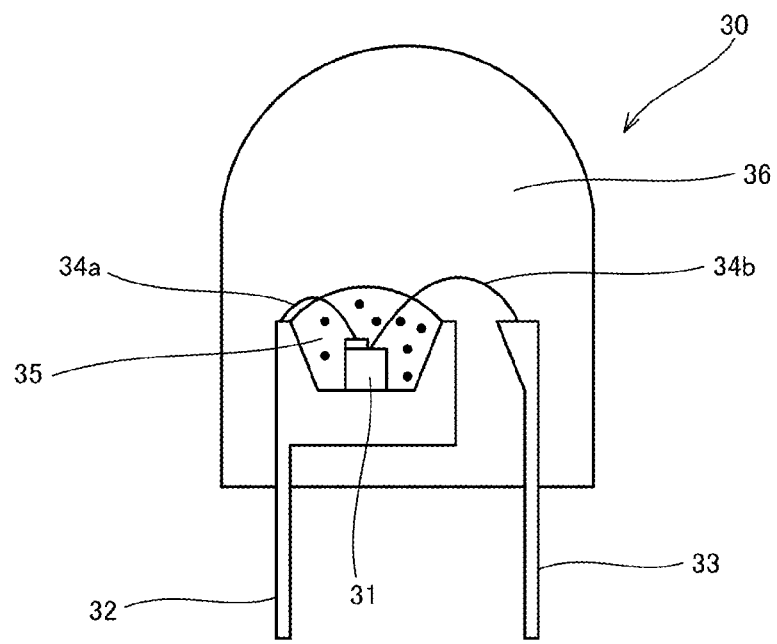
Figure 12:
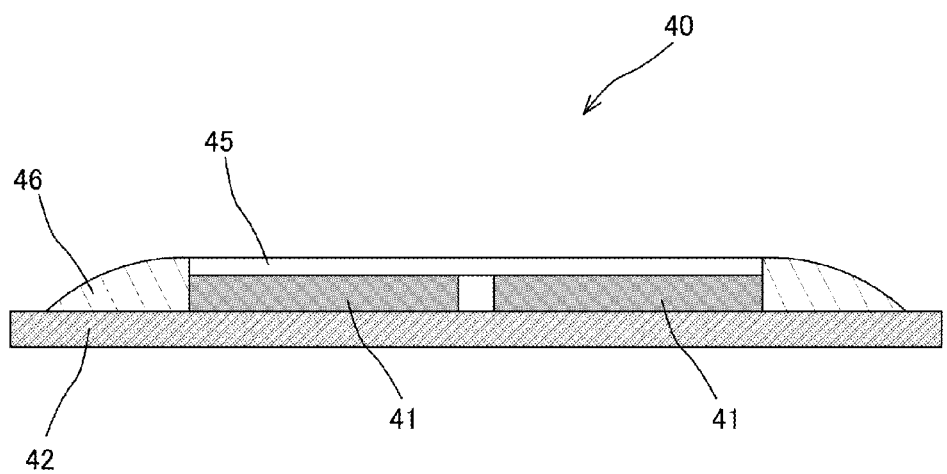
FIG. 12 is a cross-sectional view showing another conventional semiconductor light-emitting device.

FIG. 10a is a schematic perspective view showing an exemplary vehicle headlight using a semiconductor light-emitting device made in accordance with principles of the disclosed subject matter, and FIG. 10b is an enlarged top view showing the semiconductor light-emitting device. The light-emitting device 100 can emit light having a high light-emitting efficiency and an uniform color tone even when a plurality of light-emitting chips is used, from a small light-emitting surface that is slightly larger than the top surface of the plurality of light-emitting chips and that is formed in a point light source shape. In addition, a light intensity near the main optical axis of the device can be increased by concentrating the light-emitting chips near the main optical axis so as to match a light distribution pattern for the vehicle headlight.

The vehicle headlight 110 can include: the light-emitting device 100; a heat sink 102 mounting the light-emitting device 100 via a mounting base board 103; and a reflector 101 having an opening portion located adjacent the heat sink 102 so that light emitted from the semiconductor light-emitting device 100 is emitted in a light-emitting direction of the vehicle headlight 110 from the opening portion of the reflector 101. Therefore, the disclosed subject matter can provide vehicle headlights having a favorable light distribution pattern with a simple optical structure.

The above-described embodiments are described with respect to a case where the device includes the plurality of semiconductor light-emitting chips 11. When one semiconductor light-emitting chip is used for the device in place of the plurality of light-emitting chips 11, the device includes the only outer meniscus control structure without the meniscus control structure. However, the above-described features in the embodiments and the manufacturing methods, such as the various small light-emitting surfaces, the side slant surface 130 used as the reflector and the like can also be utilized for the device including the one semiconductor light-emitting chip.

As described above, the disclosed subject matter can form a light-emitting surface in small various shapes such that are slightly larger than the top surface of at least one semiconductor light-emitting chip 11, and can improve a light-emitting efficiency by using the side slant surface 130 of the reflective material layer 15 as a reflector for the at least one light-emitting chip 11. In addition, even when a plurality of light-emitting chips 11 is mounted on the base board 10, a variation of a color tone and a light intensity between the light-emitting chips 11 can be reduced. Thus, the disclosed subject matter can provide a semiconductor light-emitting device having various small light-emitting surfaces and a high light-emitting efficiency, which can be used for lighting units such as a vehicle headlight that controls light emitted from the light-emitting device using a reflector and/or a projector lens.

Moreover, the side slant surface 130 can be formed by disposing the uncured wavelength converting material 13' on the top surface of the at least one light-emitting chip 11 and by disposing the uncured reflective material between the frame 16 and the wavelength converting layer 13 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 13 including at least one phosphor, and therefore can also be used as a light source device for various applications such as general lighting, a street light, stage lighting, traffic lights and the like using a small and simple optical structure. In addition, it is conceived that each of the different aspects and features of the different embodiments disclosed herein could be used interchangeably in and with the other disclosed embodiments. For example, the multiple chip embodiment could include slant surfaces 130 that are concave. In addition, one side of a device can include a slant surface 130 that is convex while another side of the device includes a slant surface 130 that is concave. In addition, it is contemplated that any different color chip or different wavelength converting material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
a base board having a mounting surface and a conductor pattern formed on the mounting surface;
a semiconductor light-emitting chip having a bottom surface, a top surface and an outside surface, and including chip electrodes adjacent the bottom surface, each of the chip electrodes electrically connected to a respective portion of the conductor pattern of the base board via solder bumps;
an optical plate having a side surface, a bottom surface and an edge located between the side surface and the bottom surface, the optical plate including an outer meniscus control structure having an outer surface, an inner surface and a low end, the optical plate being located over the top surface of the semiconductor light-emitting chip so that the bottom surface of the optical plate covers the top surface of the semiconductor light-emitting chip, and the outer meniscus control structure of the optical plate projects from the bottom surface of the optical plate toward the semiconductor light-emitting chip and extends along the edge of the optical plate;
a wavelength converting layer having a side surface and a thickness, the wavelength converting layer including at least one phosphor and disposed between at least one of the inner surface and the low end of the outer meniscus control structure of the optical plate and the outside surface of the semiconductor light-emitting chip so that the side surface of the wavelength converting layer extends from the outside surface of the semiconductor light-emitting chip toward the outer meniscus control structure of the optical plate;
a frame located adjacent the mounting surface of the base board so as to surround the semiconductor light-emitting chip and the wavelength converting layer; and
a reflective material layer having a side slant surface disposed between the frame and the side surface of the wavelength converting layer and both the side surface of the optical plate and the outer surface of the outer meniscus control structure of the optical plate and between the bottom surface of the semiconductor light-emitting chip and the mounting surface of the base board while also surrounding the solder bumps, wherein the side slant surface contacts with the side surface of the wavelength converting layer and extends from the outside surface of the semiconductor light-emitting chip toward the meniscus control structure of the optical plate.

2. The semiconductor light-emitting device according to claim 1, wherein the side slant surface of the reflective material layer is formed in at least one of a substantially linear shape and a convex shape having a curvature of 5 or less extending in a direction toward the semiconductor light-emitting chip between the outside surface of the semiconductor light-emitting chip and the outer meniscus control structure of the optical plate.

3. The semiconductor light-emitting device according to claim 1, wherein the semiconductor light-emitting chip is a blue light-emitting chip and the at least one phosphor of the wavelength converting layer is selected from the group consisting of a yellow phosphor, and two phosphors including a red phosphor layer and a green phosphor layer.

4. The semiconductor light-emitting device according to claim 1, further comprising:
a particulate spacer disposed in the wavelength converting layer, wherein the thickness of the wavelength converting layer is defined between the top surface of the semiconductor light-emitting chip and the bottom surface of the optical plate by supporting the bottom surface of the optical plate using the particulate spacer located on the top surface of the semiconductor light-emitting chip.

5. The semiconductor light-emitting device according to claim 1, wherein the semiconductor light-emitting chip is an ultraviolet light-emitting chip and the at least one phosphor of the wavelength converting layer includes at least one of a red phosphor, a green phosphor, and a blue phosphor.

6. The semiconductor light-emitting device according to claim 1, further comprising a plurality of semiconductor light-emitting chips.

7. A method for manufacturing the semiconductor light-emitting device according to claim 1, comprising:
providing the base board;
connecting each of the chip electrodes of the semiconductor light-emitting chip to a respective portion of the conductor pattern of the base board via the solder bumps;
disposing an uncured wavelength converting material between the bottom surface of the optical plate and the outside surface of the semiconductor light-emitting chip so as to extend from the outside surface of the semiconductor light-emitting chip toward the outer meniscus control structure of the optical plate; and
disposing an uncured reflective material at least between the frame and the side surface of the wavelength converting layer and both the side surface of the optical plate and the outer surface of the outer meniscus control structure of the optical plate and between the bottom surface of the semiconductor light-emitting chip and the mounting surface of the base board.

8. A semiconductor light-emitting device comprising:
a base board having a mounting surface and a conductor pattern formed on the mounting surface;
a plurality of semiconductor light-emitting chips each having a bottom surface, a top surface and an outside surface including opposite side surfaces and second side surfaces located between the opposite side surfaces, each of the semiconductor light-emitting chips formed in a substantially cubic shape and including chip electrodes adjacent the bottom surface, each of the chip electrodes electrically connected to a respective portion of the conductor pattern of the base board via solder bumps, and the plurality of semiconductor light-emitting chips aligned so that the opposite side surfaces of each of the semiconductor light-emitting chips are substantially parallel with respect to each other;
an optical plate having a side surface, a bottom surface and an edge located between the side surface and the bottom surface, the optical plate including a meniscus control structure and being located over the top surface of each of the semiconductor light-emitting chips so that the bottom surface of the optical plate covers the top surface of each of the semiconductor light-emitting chips, and the meniscus control structure extends in an longitudinal direction underneath the bottom surface of the optical plate and along a virtual substantially central surface between adjacent light-emitting chips of the plurality of light-emitting chips, and the meniscus control structure dividing the bottom surface of the optical plate by the meniscus control structure, wherein a cross-sectional shape as viewed from the longitudinal direction of the meniscus control structure is formed in either a convex shape projecting from the bottom surface of the optical plate toward the virtual substantially central surface between the adjacent light-emitting chips or a concave shape denting from the bottom surface of the optical plate;

a wavelength converting layer having a thickness and side surfaces, the wavelength converting layer including at least one phosphor, and the wavelength converting layer disposed between each of the second side surfaces of each of the semiconductor light-emitting chips and a respective edge of the optical plate divided by the meniscus control structure adjacent the second side surfaces and between each of the opposite side surfaces of each of the semiconductor light-emitting chips and at least one meniscus control structure of the optical plate adjacent the opposite side surfaces and an edge of the optical plate, which is located between respective edges of the optical plate adjacent the second side surfaces, adjacent one of the opposite side surfaces so that a respective one of the side surfaces of the wavelength converting layer extends from the outer side surface of each of the semiconductor light-emitting chips toward the at least one meniscus control structure of the optical plate adjacent the opposite side surfaces of each of the semiconductor light-emitting chips and the edges of the optical plate adjacent the one of the opposite side surfaces and/or the second side surfaces of each of the semiconductor light-emitting chips;

a frame located adjacent the mounting surface of the base board so as to surround the wavelength converting layer and the semiconductor light-emitting chips; and a reflective material layer having side slant surfaces disposed between the frame and both the side surfaces of the wavelength converting layer and the side surface of the optical plate and between the bottom surface of each of the semiconductor light-emitting chips and the mounting surface of the base board while surrounding the solder bumps, wherein a respective one of the side slant surfaces of the reflective material layer contacts with the respective one of the side surfaces of the wavelength converting layer and extends from the outside surface of each of the semiconductor light-emitting chips toward the at least one meniscus control structure of the optical plate adjacent the opposite side surfaces of each of the semiconductor light-emitting chips and the edges of the optical plate adjacent the one of the opposite side surfaces and/or the second side surfaces of each of the semiconductor light-emitting chips.

9. The semiconductor light-emitting device according to claim 8, wherein the convex shape of the meniscus control structure of the optical plate is located between the bottom surface of the optical plate and an extended imaginary surface extending from each top surface of the adjacent light-emitting chips of the plurality of light-emitting chips.

10. The semiconductor light-emitting device according to claim 8, wherein the respective one of the side slant surfaces of the reflective material layer is formed in at least one of a substantially linear shape and a convex shape having a curvature of 5 or less extending in a direction toward each of the semiconductor light-emitting chips between the outside surface of each of the semiconductor light-emitting chips and the at least one meniscus control structure of the optical plate adjacent the opposite side surfaces of each of the semiconductor light-emitting chips and the edges of the optical plate adjacent the one of the opposite side surfaces and/or the second side surfaces of each of the semiconductor light-emitting chips.

11. The semiconductor light-emitting device according to claim 8, further comprising:
a particulate spacer disposed in the wavelength converting layer, wherein the thickness of the wavelength converting layer is defined between at least one top surface of the semiconductor light-emitting chips and the bottom surface of the optical plate by supporting the bottom surface of the optical plate using the particulate spacer located on the at least one top surface of the semiconductor light-emitting chips.

12. The semiconductor light-emitting device according to claim 8, wherein each of the semiconductor light-emitting chips is a blue light-emitting chip and the at least one phosphor of the wavelength converting layer is selected from the group consisting of a yellow phosphor, and two phosphors including a red phosphor layer and a green phosphor layer.

13. The semiconductor light-emitting device according to claim 8, wherein each of the semiconductor light-emitting chips is an ultraviolet light-emitting chip and the at least one phosphor of the wavelength converting layer includes at least one of a red phosphor, a green phosphor, and a blue phosphor.

14. A vehicle headlight including the semiconductor light-emitting device according to 8, further comprising:
a heat sink connected with the semiconductor light-emitting device; and
a reflector having an opening portion located adjacent the heat sink so that light emitted from the semiconductor light-emitting device during operation of the semiconductor light-emitting device is emitted in a light-emitting direction of the vehicle headlight from the opening portion of the reflector.

15. A method for manufacturing the semiconductor light-emitting device according to claim 8, comprising:
providing the base board;
connecting each of the chip electrodes of the semiconductor light-emitting chips to a respective portion of the conductor pattern of the base board via the solder bumps;
disposing an uncured wavelength converting material between the bottom surface of the optical plate and the outside surface of each of the semiconductor light-emitting chips so that the respective one of the side surfaces of the wavelength converting layer extends from the outer side surface of each of the semiconductor light-emitting chips toward the at least one meniscus control structure of the optical plate adjacent the opposite side surfaces of each of the semiconductor light-emitting chips and the edges of the optical plate adjacent the one of the opposite side surfaces and/or the second side surfaces of each of the semiconductor light-emitting chips; and
disposing an uncured reflective material at least between the frame and both the side surfaces of the wavelength converting layer and the side surface of the optical plate and between the bottom surface of each of the semiconductor light-emitting chips and the mounting surface of the base board.

16. The semiconductor light-emitting device according to claim 8, further comprising:
an outer meniscus control structure projecting from the bottom surface of the optical plate toward the semiconductor light-emitting chips and extending along the edge of the optical plate, wherein the respective one of the side surfaces of the wavelength converting layer extends from the outer side surface of each of the semiconductor light-emitting chips toward a respective portion of the outer meniscus control structure adjacent the one of the opposite side surfaces and/or the second side surfaces of each of the semiconductor light-emitting chips and the at least one meniscus control structure of the optical plate adjacent the opposite side surfaces of each of the semiconductor light-emitting chips, and the respective one of the side slant surfaces of the reflective material layer extends from the outside surface of each of the semiconductor light-emitting chips toward the respective portion of the outer meniscus control structure adjacent the one of the opposite side surfaces and/or the second side surfaces of each of the semiconductor light-emitting chips and the at least one meniscus control structure of the optical plate adjacent the opposite side surfaces of each of the semiconductor light-emitting chips.

17. The semiconductor light-emitting device according to claim 16, wherein the convex shape of the meniscus control structure of the optical plate is located between the bottom surface of the optical plate and an extended imaginary surface extending from each top surface of the adjacent light-emitting chips of the plurality of light-emitting chips.

18. The semiconductor light-emitting device according to claim 16, wherein the respective one of the side slant surfaces of the reflective material layer is formed in at least one of a substantially linear shape and a convex shape having a curvature of 5 or less extending in a direction toward each of the semiconductor light-emitting chips between the outside surface of each of the semiconductor light-emitting chips and the at least one meniscus control structure of the optical plate adjacent the opposite side surfaces of each of the semiconductor light-emitting chips and the edges of the optical plate adjacent the one of the opposite side surfaces and/or the second side surfaces of each of the semiconductor light-emitting chips.

19. The semiconductor light-emitting device according to claim 16, further comprising:
   a particulate spacer disposed in the wavelength converting layer, wherein the thickness of the wavelength converting layer is defined between at least one top surface of the semiconductor light-emitting chips and the bottom surface of the optical plate by supporting the bottom surface of the optical plate using the particulate spacer located on the at least one top surface of the semiconductor light-emitting chips.

20. A vehicle headlight including the semiconductor light-emitting device according to 16, further comprising:
   a heat sink connected with the semiconductor light-emitting device; and
   a reflector having an opening portion located adjacent the heat sink so that light emitted from the semiconductor light-emitting device during operation of the semiconductor light-emitting device is emitted in a light-emitting direction of the vehicle headlight from the opening portion of the reflector.

* * * * *